(12) United States Patent
Smith (10) Patent No.: US 8,327,027 B2
(45) Date of Patent: Dec. 4, 2012

(54) DATA COMPRESSION SYSTEM AND METHOD

(76) Inventor: Bryan Smith, Chicago, IL (US)

( * ) Notice: Subject to any disclaimer, the term of this patent is extended or adjusted under 35 U.S.C. 154(b) by 709 days.

(21) Appl. No.: 12/477,374

(22) Filed: Jun. 3, 2009

(65) Prior Publication Data

US 2009/0300220 A1 Dec. 3, 2009

Related U.S. Application Data (60) Provisional application No. 61/106,541, filed on Oct. 17, 2008, provisional application No. 61/058,519, filed on Jun. 3, 2008.

(51) Int. Cl.
 *G06F 15/16* (2006.01)
(52) U.S. Cl. ............................ 709/247; 375/240; 341/67
(58) Field of Classification Search .................. 709/247; 375/240; 341/67
 See application file for complete search history.

(56) References Cited

U.S. PATENT DOCUMENTS

| | | | |
|---|---|---|---|
| 3,390,380 A | | 6/1968 | Cooke-Yarborough et al. |
| 4,151,421 A | * | 4/1979 | Sumi .......................... 250/492.2 |
| 4,464,650 A | | 8/1984 | Eastman et al. |
| 4,626,829 A | | 12/1986 | Hauck |
| 5,260,693 A | * | 11/1993 | Horsley ........................... 341/67 |
| 6,191,710 B1 | * | 2/2001 | Waletzki .......................... 341/63 |
| 6,247,015 B1 | * | 6/2001 | Baumgartner et al. ............... 1/1 |
| 2004/0017950 A1 | * | 1/2004 | Chen et al. ..................... 382/239 |

OTHER PUBLICATIONS

Ziv et al; "A Universal Algorithm for Sequential Data Compression" IEEE Transactions on Information Theory, vol. IT-23, No. 3, May 1977; whole document.*
Ziv et al; "Compression of Individual Sequences via Variable-Rate Coding" IEEE Transactions on Information Theory, vol. IT-24, No. 5, Sep. 1978; whole document.*
David Salomon; Data Compression, The Complete Reference; 2007; pp. 20-28; Fourth Edition; Springer; London.
David Salomon; Data Compression, The Complete Reference; 2007; p. 253; Fourth Edition; Springer; London.
David Salomon; Data Compression, The Complete Reference; 2007; p. 289; Fourth Edition; Springer; London.
David Salomon; Data Compression, The Complete Reference; 2007; pp. 329-352; Fourth Edition; Springer; London.
David Salomon; Data Compression, The Complete Reference; 2007; pp. 357-360; Fourth Edition; Springer; London.
David Salomon; Data Compression, The Complete Reference; 2007; pp. 513-518; Fourth Edition; Springer; London.

* cited by examiner

*Primary Examiner* — Thomas Dailey
(74) *Attorney, Agent, or Firm* — Frost Brown Todd LLC (57) ABSTRACT

A specially programmed computer encodes repeating sequences of equidistant-spaced bit series that are identified in an input file. The position of each sequence is encoded relative to one or more instances of the previous sequence, including both the spacing between bits and the bit position of identified portions of each. For a certain class of input files, this encoding of repeating sequences significantly compresses the input file into the output file. A specially programmed computer decodes files that have been encoded in this manner.

18 Claims, 10 Drawing Sheets

DATA COMPRESSION SYSTEM AND METHOD

REFERENCE TO RELATED APPLICATIONS

This application is a nonprovisional of, and claims priority to U.S. Provisional Application No. 61/058,519 (DATA COMPRESSION SYSTEM AND METHOD), filed Jun. 3, 2008, and U.S. Provisional Application No. 61/106,541 (DATA COMPRESSION SYSTEM AND METHOD), filed Oct. 17, 2008.

FIELD

The present invention relates to arithmetic processing and calculating using electrical computers. More specifically, the present invention relates to representing a number or group of numbers by a smaller number of digits than that possessed originally or the inverse operation.

DESCRIPTION

For the purpose of promoting an understanding of the principles of the present invention, reference will now be made to the embodiment illustrated in the drawings and specific language will be used to describe the same. It will, nevertheless, be understood that no limitation of the scope of the invention is thereby intended; any alterations and further modifications of the described or illustrated embodiments and any further applications of the principles of the invention as illustrated therein are contemplated as would normally occur to one skilled in the art to which the invention relates.

Generally, one form of the present invention relates to a computing device programmed to convert a digital input file into a compressed or encoded digital output file. Alternative embodiments operate on data streams using lookahead encoding as will occur to those skilled in the art.

For the purpose of this disclosure, a "bit" is a binary digit. A "bit series" is an ordered group of bits. A "spaced series" is a bit series that has zero or more bits positions between each bit in the series. A "sequence" is a spaced series appearing one or more times ("instances") to collectively make a "pattern." Each instance within a given pattern is spaced the same number of bit positions from the prior instance. A prototypical instance within a pattern is referred to as the "sequence," while other instances (which might appear before or after the sequence) are called "repetitions."

Figure 1:
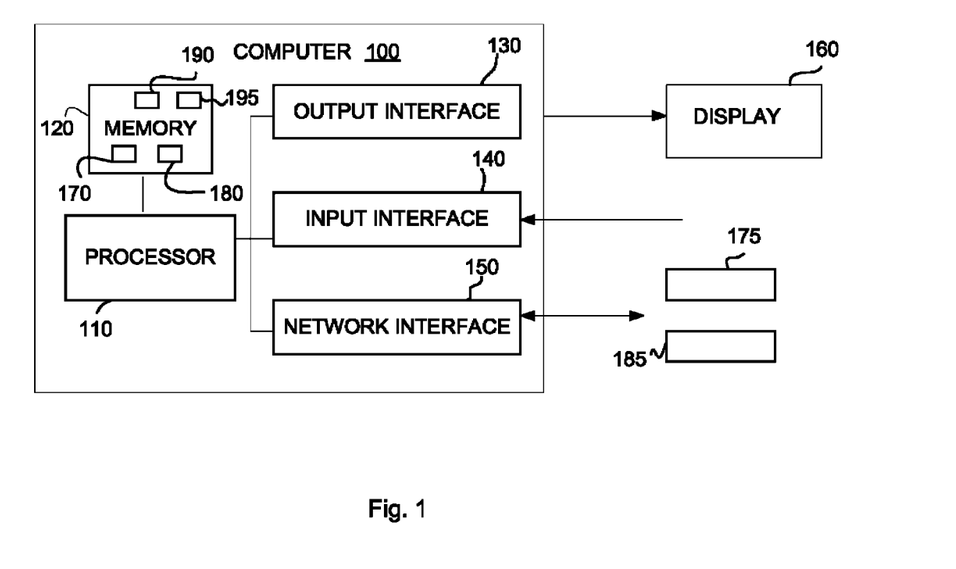
FIG. 1 is a schematic diagram of a system used in a first embodiment.

The computers used as servers, clients, resources, interface components, and the like for the various embodiments described herein generally take the form shown in FIG. 1. Computer 200, as this example will generically be referred to, includes processor 210 in communication with memory 220, output interface 230, input interface 240, and network interface 250. Power, ground, clock, and other signals and circuitry are omitted for clarity, but will be understood and easily implemented by those skilled in the art.

With continuing reference to FIG. 1, network interface 250 in this embodiment connects computer 200 a data network for communication of data between computer 200 and other devices attached to the network. Input interface 240 manages communication between processor 210 and one or more push-buttons, UARTs, IR and/or RF receivers or transceivers, decoders, or other devices, as well as traditional keyboard and mouse devices. Output interface 230 provides a video signal to display 260, and may provide signals to one or more additional output devices such as LEDs, LCDs, or audio output devices, or a combination of these and other output devices and techniques as will occur to those skilled in the art.

Processor 210 in some embodiments is a microcontroller or general purpose microprocessor that reads its program from memory 220. Processor 210 may be comprised of one or more components configured as a single unit. Alternatively, when of a multi-component form, processor 210 may have one or more components located remotely relative to the others. One or more components of processor 210 may be of the electronic variety including digital circuitry, analog circuitry, or both. In one embodiment, processor 210 is of a conventional, integrated circuit microprocessor arrangement, such as one or more CORE 2 QUAD processors from INTEL Corporation of 2200 Mission College Boulevard, Santa Clara, Calif. 95052, USA, or ATHLON or PHENOM processors from Advanced Micro Devices, One AMD Place, Sunnyvale, Calif. 94088, USA. In alternative embodiments, one or more application-specific integrated circuits (ASICs), general-purpose microprocessors, programmable logic arrays, or other devices may be used alone or in combination as will occur to those skilled in the art.

Likewise, memory 220 in various embodiments includes one or more types such as solid-state electronic memory, magnetic memory, or optical memory, just to name a few. By way of non-limiting example, memory 220 can include solid-state electronic Random Access Memory (RAM), Sequentially Accessible Memory (SAM) (such as the First-In, First-Out (FIFO) variety or the Last-In First-Out (LIFO) variety), Programmable Read-Only Memory (PROM), Electrically Programmable Read-Only Memory (EPROM), or Electrically Erasable Programmable Read-Only Memory (EEPROM); an optical disc memory (such as a recordable, rewritable, or read-only DVD or CD-ROM); a magnetically encoded hard drive, floppy disk, tape, or cartridge medium; or a plurality and/or combination of these memory types. Also, memory 220 is volatile, nonvolatile, or a hybrid combination of volatile and nonvolatile varieties.

Encoding

In this embodiment, encoder 190 reads input file 170 and encodes it into output file 180. Encoder 190 is also enabled to accept input stream 175 through network interface 150. An alternative output is output stream 185, which also leaves computer 100 through network interface 150. Likewise, decoder 195 can take an encoded input file 180 or encoded network stream 185 and decoded using the techniques described herein to produce decoded output file 170 or decoded output stream 175.

Figure 2:
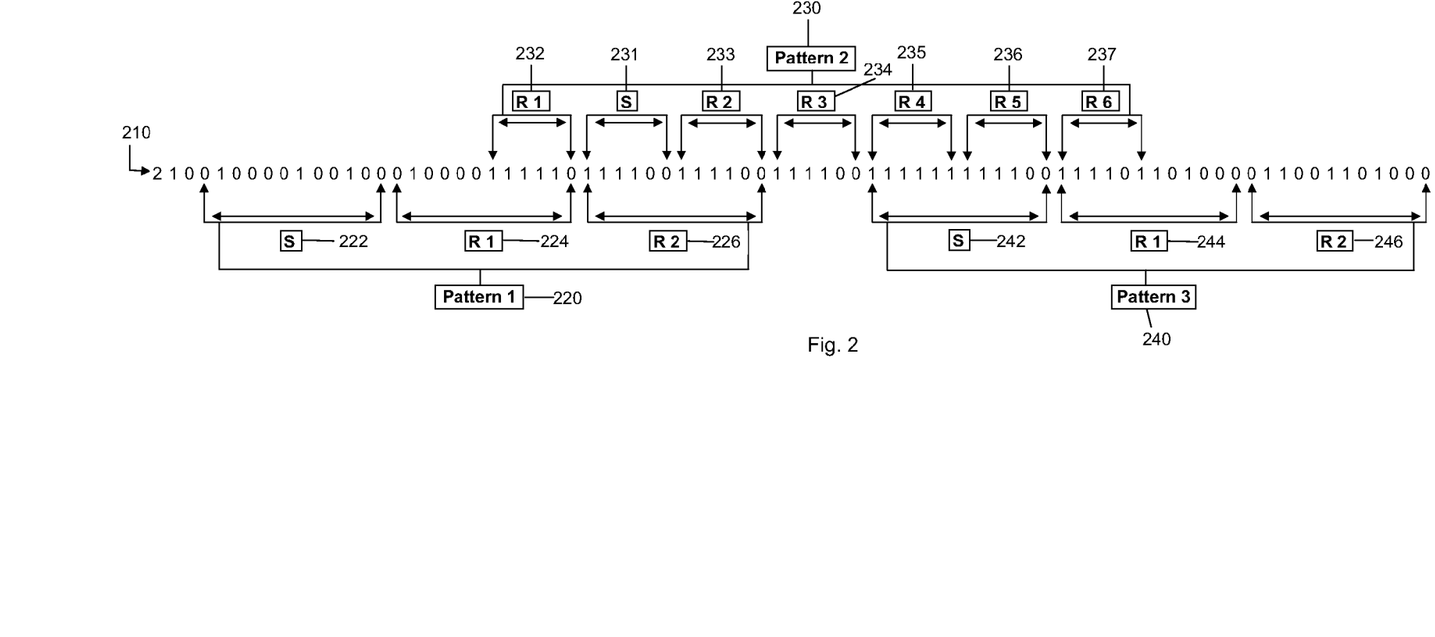
FIG. 2 is a diagram illustrating an uncompressed data stream with patterns identified according to a first embodiment.

Turning to FIG. 2, the identification and encoding of sequences within the uncompressed input file will be described. Input file 210 is first examined for repeating sequences. This scanning of the input file considers either 1-bits or 0-bits, ignoring the other, as will be shown in the detailed examples herein. Note that the sequence might or might not include a contiguous set of bits, and might not even include all 1-bits (or 0-bits) within a particular range of bit positions, as discussed in connection with some of the examples herein. Depending on the design of the system, which will include design decisions within the ability of those of ordinary skill in the art, the patterns that are encoded by the encoder are selected as a function of measures including, but not necessarily limited to: the total number of bits in each sequence, the availability of equidistant sequences, and the positioning of each pattern in relation to nearby patterns for convenient placement and efficient encoding of the relevant position.

Figure 3:
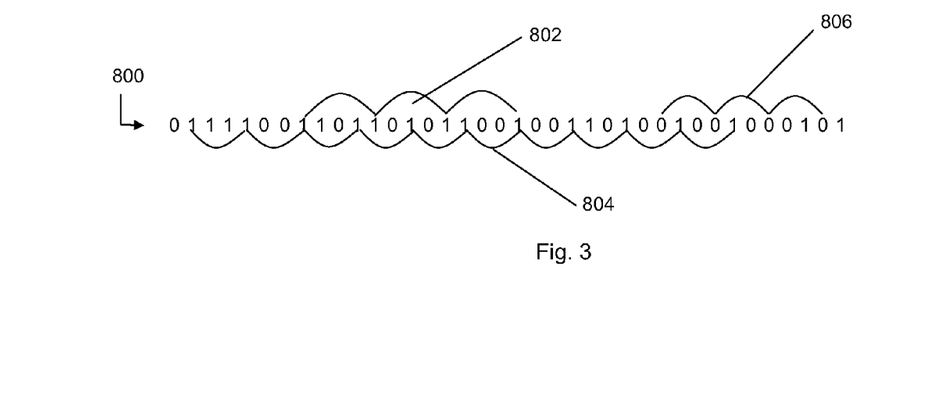
FIG. 3 is a diagram of equidistant bit series in a digital data file.

FIG. 3 illustrates multiple spaced series within bit series 800 that could be encoded according to the techniques described herein. For example, spaced series 802 consists of four 1-bits positioned equidistantly (exactly three bit positions between each 1-bit) from each other. Spaced series 804 is eleven 1-bits, each with two bit positions between them, and spaced series 806 is four 0-bits with two bit positions between each consecutive pair of bits in the pattern.

Figure 4:
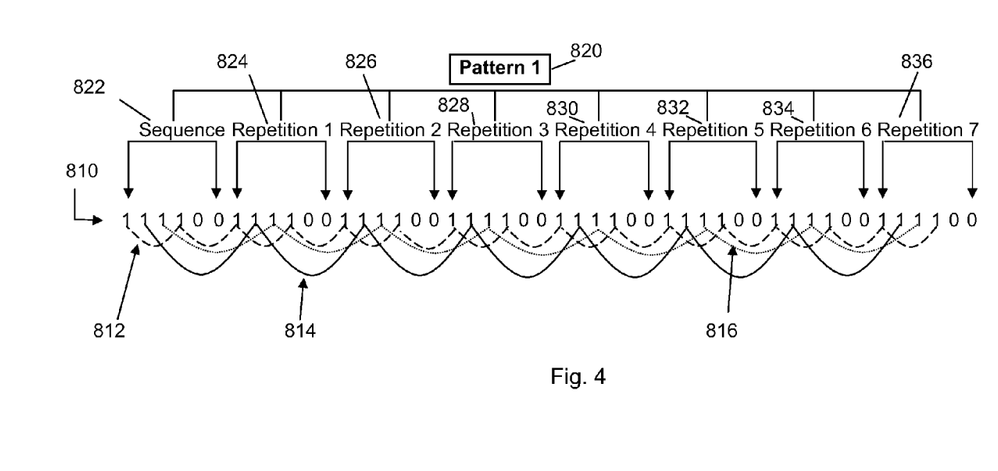
FIG. 4 is a diagram illustrating grouping of equidistant "spaced sequences" in a digital data file.

FIG. 4 illustrates how multiple equidistant spaced series can be grouped into a pattern for encoding as discussed herein. Spaced series 812 within bit series 810 includes sixteen 1-bits with two bit spaces between each consecutive pair of 1-bits in the series. Spaced series 814 includes eight 1-bits with five bit positions between each consecutive pair of 1-bits, while spaced series 816 includes eight 1-bits with five bit positions between each consecutive pair of 1-bits. These can be combined by the encoder into a single pattern 820, which includes sequence 822 and subsequent repetitions 824, 826, 828, 830, 832, 834, and 836.

Figure 5:
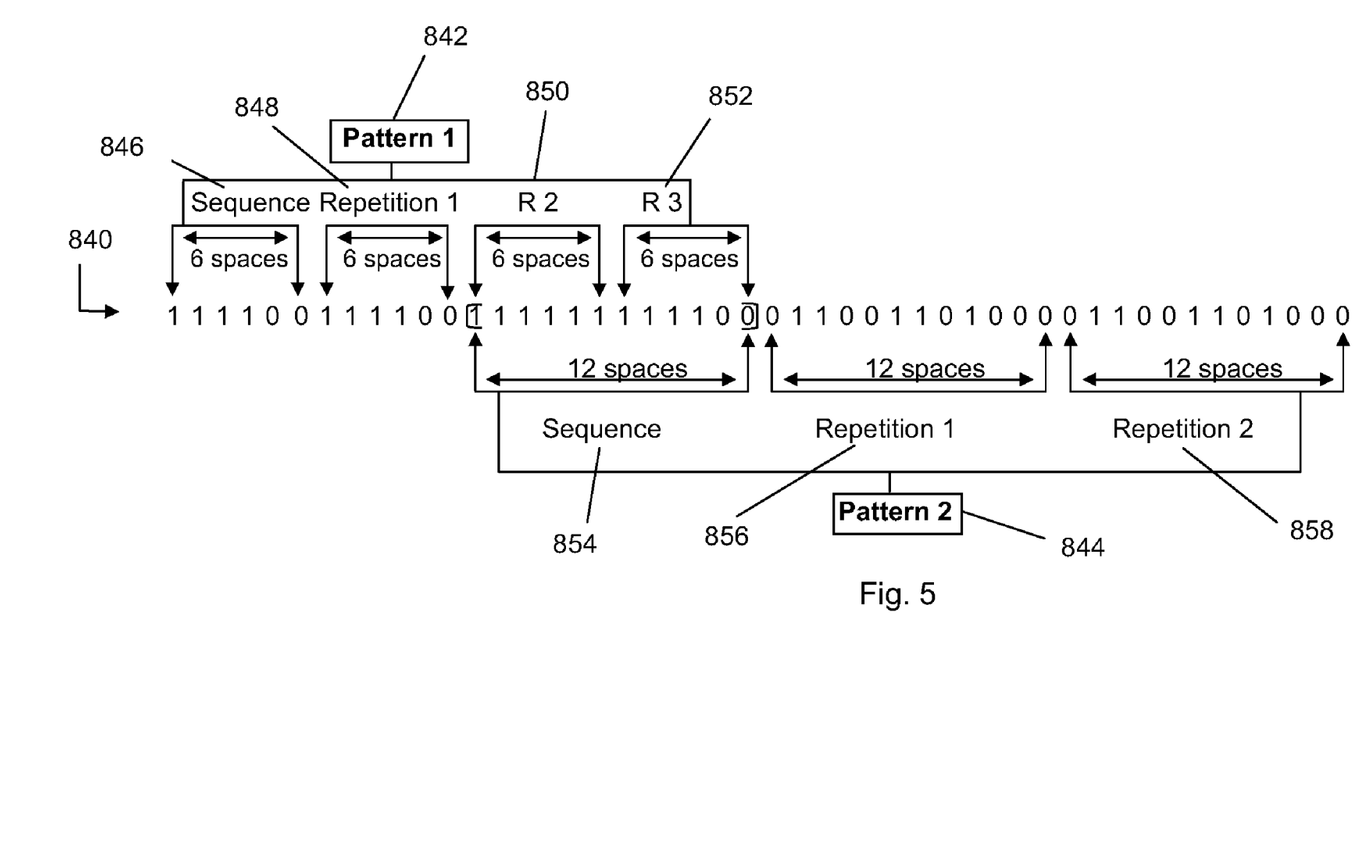
FIG. 5 is a diagram illustrating the overlapping relationship between patterns in a digital data file.

The connection between patterns is encoded based on techniques and observations illustrated with reference to bit series 840 in FIG. 5. Pattern 842 includes sequence 846 ("111100") and three repetitions 848, 850, and 852. Pattern 844 includes sequence 854 ("011001101000") and repetitions 856 and 858. When these patterns 842 and 844 are overlaid (using a bitwise OR operation where they overlap), the result is bit series 840.

As the encoder encodes these patterns from the input file, it observes that repetitions 850 and 852 from pattern 842 are aligned as sequence 854 of pattern 844. Observing this alignment, the encoder encodes those last two repetitions 850 and 852 within pattern 842 with the "ratio bits" as described herein. Then, within the encoding of pattern 844, the first instance of sequence 854 is automatically placed correctly in that overlapping position.

In this exemplary embodiment, pattern 220 includes sequence 222 and two repetitions, 224 and 226. The sequence "010000100100" appears literally at 222, but in repetition 224 some of the bits that match the 0-bits in sequence 222 appear as 1-bits. The system does not take into account the bits that appear between 1-bits in a sequence, so these intervening bits are simply not encoded in this pattern. These bits are saved for encoding as part of a different pattern.

Figure 6:
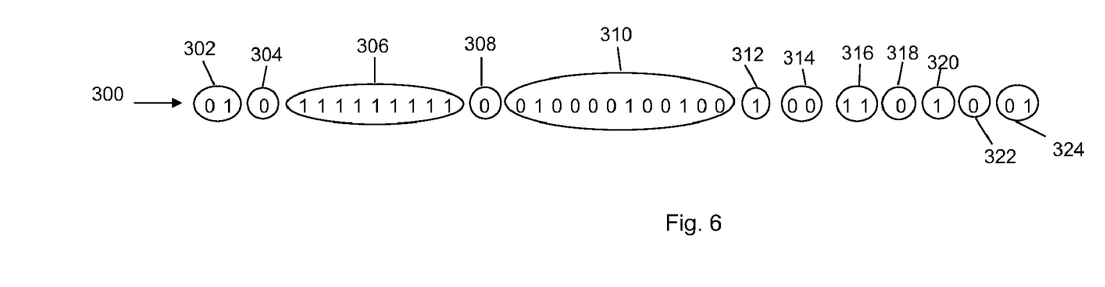
FIG. 6 is a diagram illustrating a first encoding of a pattern according to the first embodiment.

FIG. 6 illustrates encoding of the first pattern 220 in the output file according to this exemplary embodiment. The output file begins with bit pair 302 ("01"), which in this embodiment signifies the beginning of a pattern encoding. The next bit in the output file is a 0-bit 304, which indicates that the last bit in the sequence being encoded is a 0-bit. The length of the sequence is then encoded in unary, comprising a sequence 306 of 1-bits having a length equal to the sequence being encoded, followed by a 0-bit 308 to signify the end of that encoding. Since the number of bits in the sequence that match the ending bit is now known, the actual sequence 222 is then repeated in its entirety at 310. The decoder knows when the sequence is complete because it has the count of ending bits (0-bits in this case) to wait for.

The system then encodes the number of repetitions of the sequence (after the sequence itself) make up the pattern. For pattern 220, there is only one additional repetition (repetition 224) that appears after the original sequence 222 and before the repetition 226 that will form a link to the position of the next pattern 230 to be encoded. A single 1-bit 312 indicates that only one additional repetition is needed, followed by two 0-bits 314. The first 0-bit ends the unary count of repetitions, and the second indicates that the next repetition is to be used as the "frame" for placing the next pattern 230 in relation to this pattern 220.

The system then encodes the ratio of spacing in the next pattern 230 in relation to the second repetition 226 of the current pattern 220. Here, the system references the current pattern's repetition with bit pair 316 ("11"), outputs a 0-bit 318 to the output file as a stop for the decoder to know to stop counting, outputs a 1-bit 320 to refer to the next pattern's sequence in size (for the ratio), and stops that reference with another 0-bit 322. The 1-bits at the beginning of these encodings indicate that the beginning of the second repetition 226 and the beginning of the sequence 231 in the second pattern 230 are aligned in the input file 210 as shown in FIG. 2. The fact that there are twice as many 1-bits in the part of the ratio relating to the current pattern 220 than in the part of the ratio relating to the next pattern 230 means that the length of the second sequence 231 (12 bits) is half that of the first sequence 222 (6 bits). The encoding of the first pattern 220 ends with another bit pair 324 ("01").

Figure 7:
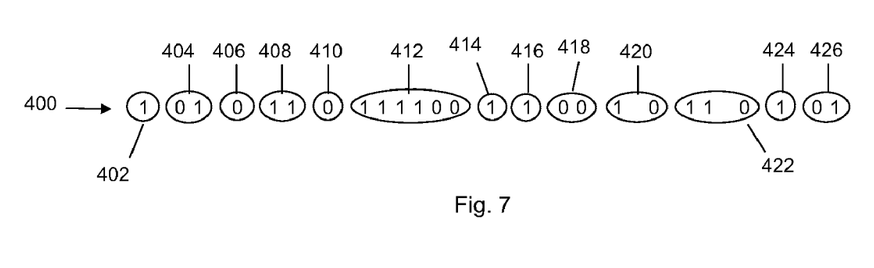
FIG. 7 is a diagram illustrating a second encoding of a pattern according to the first embodiment.

The second pattern 230 is encoded by the system as shown in FIG. 7. The system adds a 1-bit 402 to the output file to indicate that there is one repetition 232 of the sequence 231 before the one that is used to align the second pattern 230 with the first pattern 220. The system then places another "01" pair 404 into the output file to indicate the start of the encoding of sequence 231, a 0-bit 406 to indicate that the last bit in the sequence is a 0-bit, "11" pair 408 to encode the number (2) of 0-bits in the sequence 231 in unary, and a 0-bit 410 to indicate the end of the unary number. Sequence 231 of pattern 230 is then included a verbatim as "111100" series 412.

The system then encodes the relative position of sequence 242 in relation to the repetitions of pattern 230. One-bits 414 and 416 indicate that two repetitions (233 and 234) of sequence 231 appear in the input file, but are not used for placement of a subsequent pattern 240. Bit pair 418 ("00") starts the frame that characterizes the overlap between a pattern 230 and pattern 240. The spacing ratio of the next pattern relative to the current pattern is then encoded. Bit series 420 ("10") encodes in unary the current pattern's part (1) of the length ratio (1:2), and bit series 422 ("110") encodes in unary the next pattern's part (2) of the length ratio. A 1-bit 424 encodes repetition 237 (after the repetitions 235 and 236 that were used to position sequence 242 of pattern 240), and bit pair "01" encodes the end of the pattern.

Figure 8:
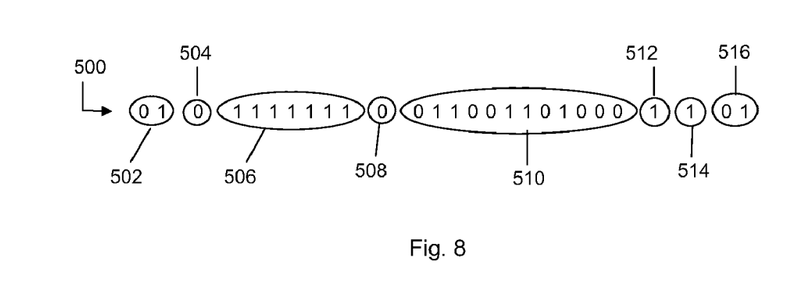
FIG. 8 is a diagram illustrating a third encoding of a pattern according to the first embodiment.

Sequence 500, illustrated in FIG. 8, encodes the third pattern 240. Bit pair 502 ("01") signals the start of the pattern, while 0-bit 504 indicates that the last value in sequence 242 will be a zero. The number of 0-bits (because last-value bit 504 was a 0-bit) in sequence 242 is encoded in unary at 506, and 0-bit 508 indicates the end of that unary encoding. Sequence 242 is included verbatim ("011001101000") in the output file at 510, which does not need to be terminated because the termination indicator 504 and the seven 0-bits 506 tell the decoder enough to specify precisely the point at which the sequence 242 will end. One-bits 512 and 514 each indicate another repetition of sequence 242, and 516 ("01") signals the end of the encoding of pattern 240.

Figure 9:
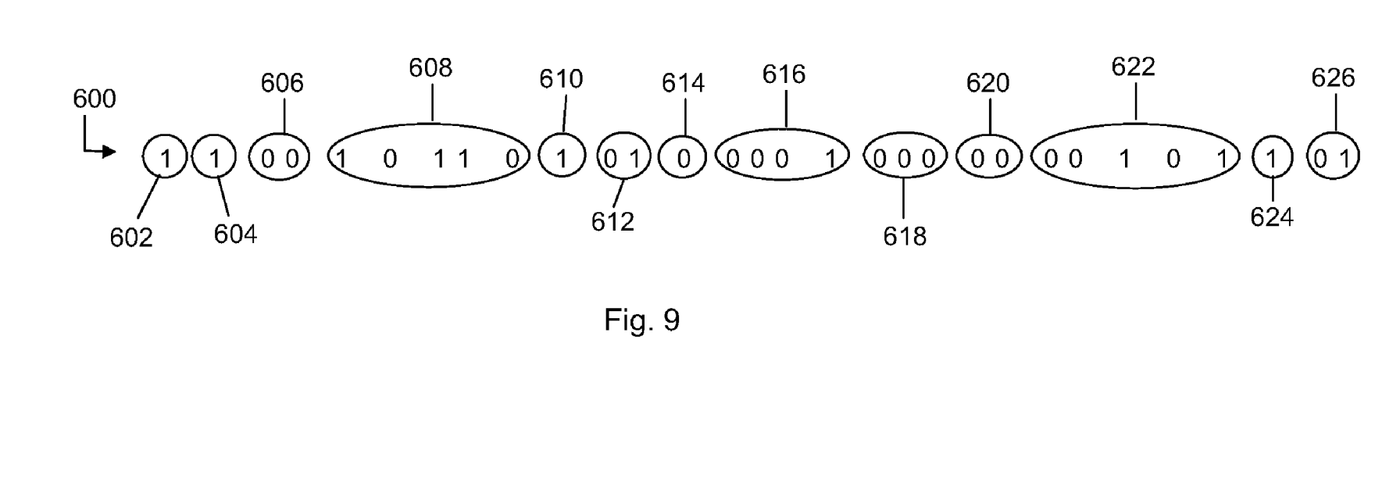
FIG. 9 is a diagram illustrating a fourth encoding of a pattern according to the first embodiment.

A further example 600 of pattern encoding is illustrated in FIG. 9. One-bits 602 and 604 indicate repetition of the current sequence, unrelated to the position of any other sequence. Bit pair 606 ("00") indicates that the next repetition is to be used as a frame. Ratio bits 608 ("10110") reflect that the next pattern is aligned with the start of the current frame repetition and the start of the next pattern's sequence. Another repetition unrelated to the position of any other pattern is encoded by 1-bit 610. Bit pair 612 ("01") indicates that the sequence will now start to be encoded. Zero-bit 614 indicates that the sequence will end with a zero, and bit series 616 ("0001") reflects the unary encoding of the number (3) of 0-bits in the sequence. Bit series 618 ("000") is the sequence itself, consisting of three 0-bits and no 1-bits. If the encoder is encoding 0-bits, then this is a simple pattern being encoded as shown above. If, on the other hand, the encoder is encoding 1-bits, then this pattern does not actually encode any bits from the input file, but might bridge other patterns from the input file.

Bit pair 620 ("00") indicates that another frame within the pattern is being encoded. Ratio bits 622 indicate that two repetitions of the current pattern of the same length as one repetition of the next pattern's sequence. One-bit 624 reflects another repetition of the current sequence (unrelated to the position of any subsequent pattern), and bit pair 626 ("01") indicates the end of encoding for this pattern.

Figure 10:
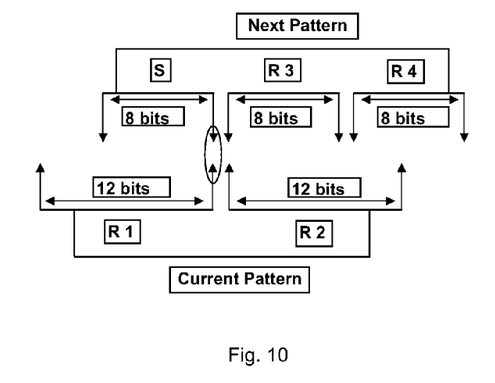
FIG. 10 is a diagram illustrating a first alignment relationship between patterns in an uncompressed data file.

In various embodiments, ratio bits are encoded in a variety of ways. As one example, illustrated in FIG. 10, the bit series "0010001" first reflects the current pattern's part of the ratio (2) with two 0-bits, and the first 1-bit is a stop bit for that unary encoding. That series then reflects the next pattern's part of the ratio (3) with three 0-bits followed by a stop bit. The encoding of both numbers in unary with 0-bits indicates that the alignment of the patterns is at their respective end-bits, not their initial first bits.

Figure 11:
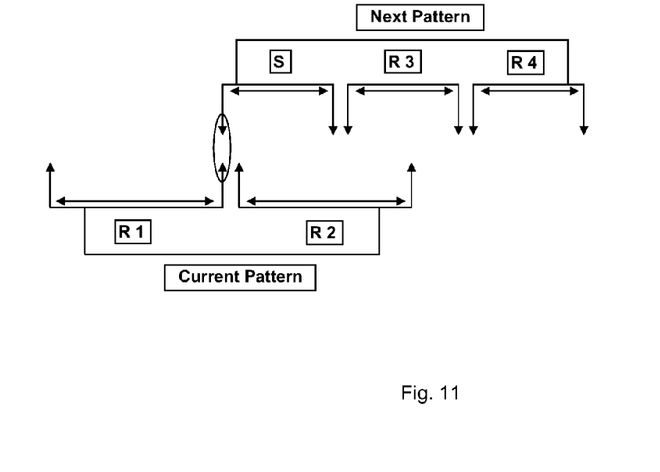
FIG. 11 is a diagram illustrating a second alignment relationship between patterns in an uncompressed data file.

Another type of encoding of ratio bits, illustrated in FIG. 11, would use the bit series "0011110." This encoding represents the current pattern's part of the ratio with "001" (unary "2" in 0-bits) and represents the next pattern's part of the ratio with "1110" (unary "3" in 1-bits). The alignment between the patterns occurs at the last bit in the current pattern's repetition and the first bit in the next pattern's sequence.

Figure 12:
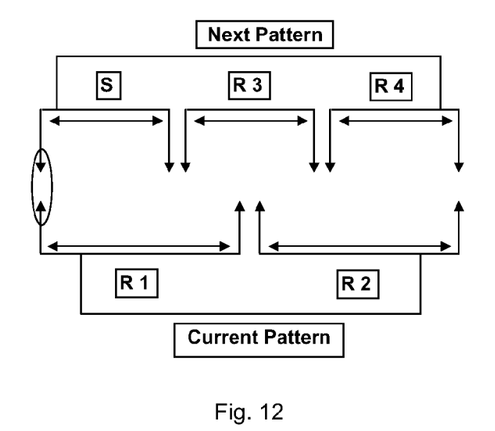
FIG. 12 is a diagram illustrating a third alignment relationship between patterns in an uncompressed data file.

A third type of encoding of ratio bits, shown in FIG. 12, is expressed with the bit series "1101110." Here, the current pattern's part and the next pattern's part of the ratio are encoded as in the first type of encoding, but the inversion of all of the bits reflects alignment of the beginnings of the respective repetition and sequence.

Figure 13:
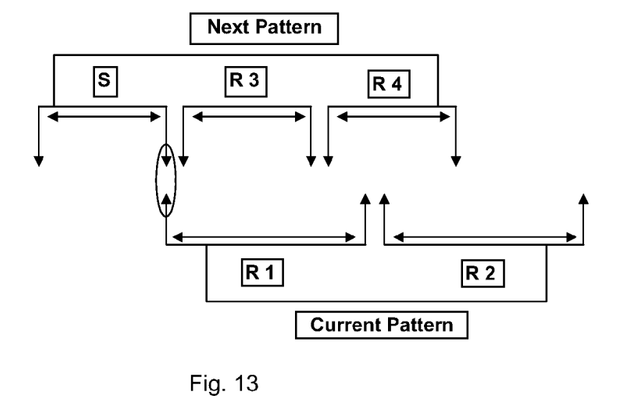
FIG. 13 is a diagram illustrating a fourth alignment relationship between patterns in an uncompressed data file.

A fourth encoding uses the same ratio as in the second type of encoding, but aligns the first bit in the repetition in the current pattern and the last bit in the next pattern. This type of alignment is shown in FIG. 13.

Decoding

Figure 14:
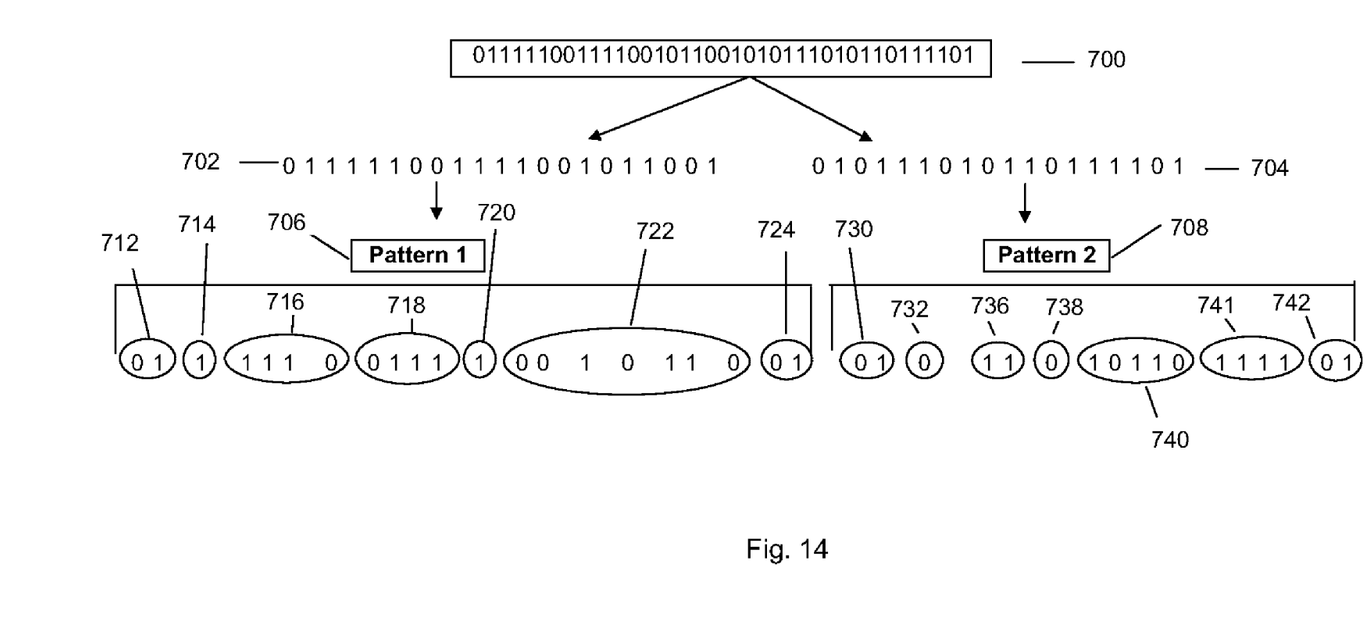
FIG. 14 is a diagram illustrating parsing and decoding of two encoded patterns from a data file.

A decoding process according to a second embodiment is shown beginning at FIG. 14. In particular, encoded bit series 700 (for example, in a digital data file) is parsed into encoded pattern 702 and encoded pattern 704 as will now be described.

Introductory bit pair 712 ("01") reflects the start of an encoded pattern 706, 1-bit 714 shows that the last digit in the sequence within this pattern is a 1-bit. A number of 1-bits in the sequencing is unary-encoded by bits 716 (including the zero stop-bit), and the sequence 718 for itself ("0111") is read. One-bit 720 reflects that a repetition occurs, so the decoder has "01110111."

Ratio bits 722 ("0010110") indicate that they are ratio bits ("00"), and that one repetition of the current pattern length ("10," a unary encoding of "1" with a stop-bit "0") corresponds to two sequence lengths in the next pattern ("110," a unary encoding of "2" with a stop-bit "0"). The fact that 1-bits are used to encode the numbers means that the beginning of the second additional repetition of the sequence in the first pattern ("0111 0111 0111") aligns with the beginning of the sequence in the second pattern 708 (yet to be decoded). Marker pair 724 indicates the end of the encoding for the first pattern.

The system then decodes pattern 708 using bit series 704. Bit pair 730 ("01") starts the encoding of the sequence bit for pattern 708. The next bit 732 is a 0-bit, so the sequence will end with a zero. The number of 0-bits in the sequence (2) is unary-encoded by bits 736 and stop bit 738, and the sequence 740 is read until that number of 0-bits has been read ("10110"). Because the ratio bits 722 from pattern 1 indicated that two instances of the sequence match up with one repetition from the prior pattern 706, two instances of sequence 740 are automatically added to the output file. Four additional 1-bits 741 reflect four additional repetitions of the sequence within pattern 708, which complete the decoded patterns shown at 755 in FIG. 15. Termination pair 742 ("01") ends encoding of pattern 708.

Figure 15:
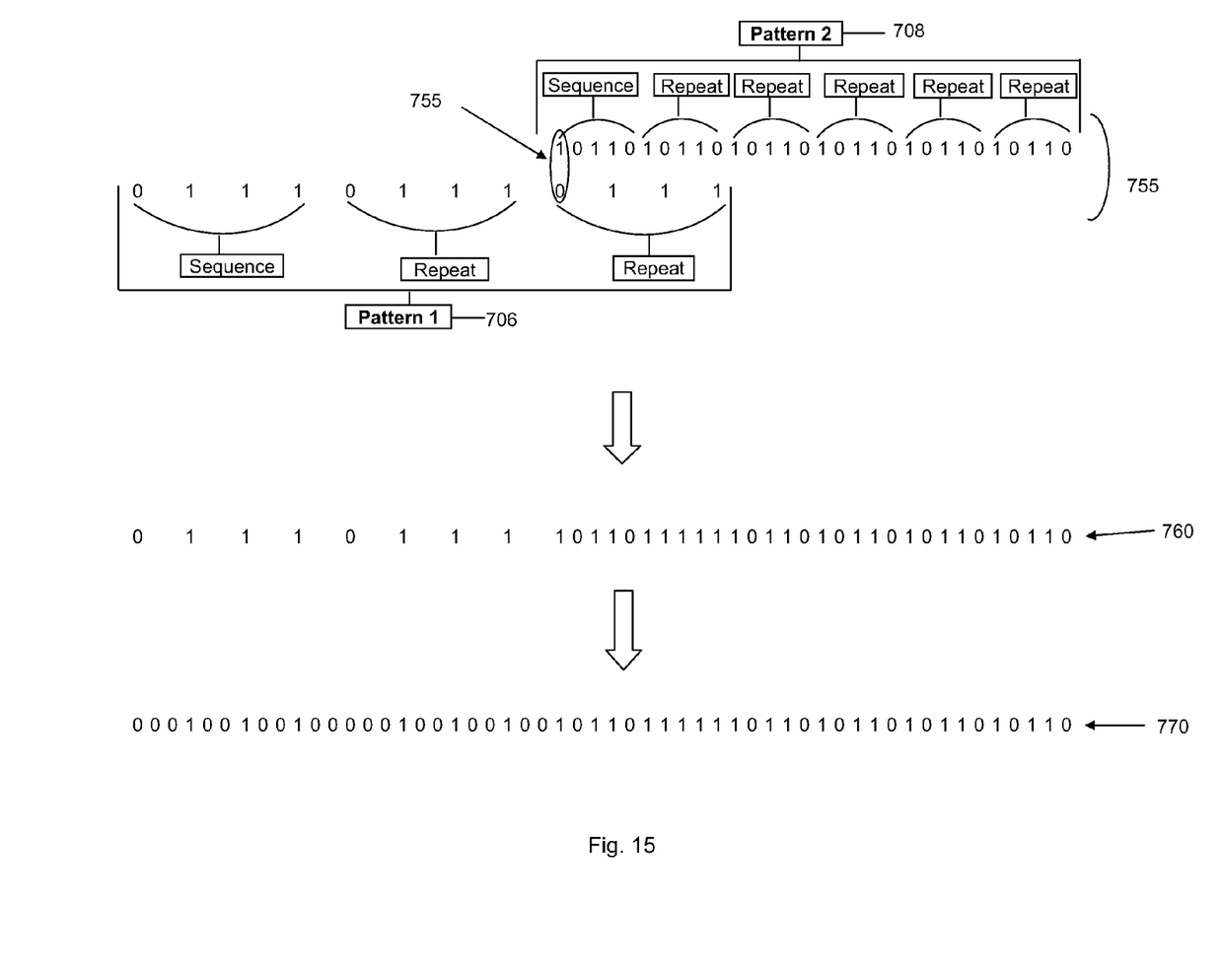
FIG. 15 is a diagram illustrating the combination of decoded patterns into a portion of a decoded output file.

FIG. 15 illustrates the relative placement and spacing of pattern 706 and pattern 708 during this decoding. The transition from the prior pattern (not shown) will indicate to the decoder that there will be two skipped bits between each bit in the sequence. Ratio bits 722, discussed just above, indicate by their encoding of a 1:2 ratio that the space in the decoded file occupied by one repetition of sequence 718 equals the space occupied by two repetitions of sequence 740. The decoder learns that pattern 706 has four bits, with two skipped bits between each consecutive pair of bits in the sequence, so one repetition takes up ten bits in the decoded file. As the decoder decodes pattern 708, it learns that sequence 740 has five bits. Given this information about the sequence lengths and the ratio between them as they are laid out in the decoded file, the decoder knows that two repetitions of sequence 740 in pattern 708 will take up ten bits, so one repetition will take up five bits, so there will be no space in the decoded file between bits in the sequence 740 or the repetitions of that sequence in pattern 708. This relative spacing is shown at 755.

As discussed above in relation to FIGS. 10-13, ratio bits 722 also encode the relative alignment between particular instances of sequence 718 (from pattern 706) and sequence 740 (from pattern 708). Since both parts of the ratio are encoded in ratio bits 722 as 1-bits (with 0-bits as stop bits), the encoding illustrated in FIG. 12 was used. This means that the first bit of the relevant repetition of the current pattern 706 lines up in the decoded file with the first bit of the sequence in the next pattern 708. The aligned bits are identified in FIG. 15 at 755. When the two decoded patterns 706 and 708 are spaced out, aligned, and combined as just discussed, they appear in the output file as shown at 760. When 0-bits fill in the spaces between the bits of sequence 718 and its repetitions (there are no spaces between the bits of sequence 740 in pattern 708), we see the bit series shown at 770.

Repetitions of the initial sequence of a pattern are contiguous in this embodiment, though alternative embodiments may encode different amounts of space between repetitions.

In some embodiments, the system will select either 0-bits or 1-bits to encode as patterns, and this selection will be encoded in the (encoded) output file. As the selected type of bits from the input file are encoded in patterns, they are changed into the opposite bit value. When all of the selected type of bits are encoded, the input file will then be full of the non-selected type of bits. In alternative embodiments, the input file is left untouched, but the encoder maintains information about portions of that file that have and have not been completely encoded. In other alternative embodiments, the input file bits from one pattern are unchanged until the next pattern is encoded, which facilitates encoding of their relative position and spacing.

In some variations, encoding of numbers (such as the length of the current sequence or the number of repetitions of a sequence within a pattern) is achieved using other methods that will occur to those skilled in the art. For example, such numbers might be encoded in some embodiments using four-bit chunks, where three bits represent values up to seven and the fourth bit indicates whether another chunk is needed. If multiple chunks are needed, the subsequent values might be added to the values from earlier chunks, or might be shifted in significance.

In embodiments wherein the original or alternative encodings are used, the numbers might be adjusted based on information known from context. For example, when the last bit value and the number of that value bit in a sequence are encoded, it would be known that the number is at least one. In that case, the system might be designed so that the value n would be encoded as n−1 to reduce the number of bits necessary to encode that value.

In some embodiments, the system catalogs many combinations of patterns that could be used to encode an input file, then analyzes the combinations to determine the "best" according to some criteria. For example, the combination yielding the best overall compression ratio, the least lookahead needed for decoding, the least memory needed in the decoder, or the like. In other embodiments, All publications, prior applications, and other documents cited herein are hereby incorporated by reference in their entirety as if each had been individually incorporated by reference and fully set forth. While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A system, comprising a processor and a memory in communication with the processor, the memory storing programming instructions executable by the processor to:
   identify a first pattern of bits and a second pattern of bits in an input file, each pattern being composed of a plurality of instances of a sequence, each sequence consisting of bits having the same value and being separated within each pattern by some multiple $x_i$ of a separation count n of bits from the next bit in the sequence, for each bit position i in the sequence;
   encode the first pattern into an output file;
   encode the second pattern into the output file; and
   encode a relative position of the second pattern into the output file expressly as a function of a position of a specified portion of the first pattern;
   where n and $x_i$ are natural numbers.

2. The system of claim 1, wherein the separation value n for the first pattern is different from the separation value n for the second pattern.

3. The system of claim 1, wherein the input file is fixed in a first tangible medium.

4. The system of claim 1, wherein the output file is fixed in a second tangible medium.

5. The system of claim 1, wherein the encoding of relative position comprises expressly encoding the ratio of the separation n of the first pattern to the separation n of the second pattern.

6. The system of claim 1, wherein the encoding of relative position comprises expressly encoding the position of the beginning of the first pattern relative to the end of the second pattern.

7. A non-transitory computer-readable medium encoded with programming instructions executable by a processor to:
   identify a first pattern of bits and a second pattern of bits in an input file, each pattern being composed of a plurality of instances of a sequence, each sequence consisting of bits having the same value and being separated each pattern by some multiple $x_i$ of a count n of bits from the next bit in the sequence, for each bit position i in the sequence;
   encode the first pattern into an output file;
   encode the second pattern into the output file; and
   encode a relative position of the second pattern into the output file expressly as a function of a position of a specified portion of the first pattern.

8. The system of claim 7, wherein the separation value n for the first pattern is different from the separation value n for the second pattern.

9. The system of claim 7, wherein the input file is fixed in a first tangible medium.

10. The system of claim 9, wherein the output file is fixed in a second tangible medium.

11. The system of claim 7, wherein the encoding of relative position comprises expressly encoding the ratio of the separation n of the first pattern to the separation n of the second pattern.

12. The system of claim 7, wherein the encoding of relative position comprises expressly encoding the position of the beginning of the first pattern relative to the end of the second pattern.

13. A system, comprising a processor and a memory in communication with the processor, the memory storing programming instructions executable by the processor to:
   decode a first pattern from an input file;
   decode a second pattern from the input file;
   decode a position of the second pattern relative to the first pattern from the input file expressly as a function of a position of a specified portion of the first pattern;

outputting the first pattern and the second pattern into an output file, positioning them relatively according to the decoded position;

wherein the first pattern and the second pattern are each composed of a plurality of instances of a sequence, each sequence consisting of bits having the same value and being separated each pattern by some multiple $x_i$ of a count n of bits from the next bit in the sequence, for each bit position in the sequence.

14. The system of claim 13, wherein the separation value n for the first pattern is different from the separation value n for the second pattern.

15. The system of claim 13, wherein the input file is fixed in a first tangible medium.

16. The system of claim 15, wherein the output file is fixed in a second tangible medium.

17. The system of claim 13, wherein the decoding of relative position comprises expressly decoding the ratio of the separation n of the first pattern to the separation n of the second pattern.

18. The system of claim 13, wherein the decoding of relative position comprises expressly decoding the position of the beginning of the first pattern relative to the end of the second pattern.

* * * * *